Nov. 12, 1963 A. J. CORNISH 3,110,629

THERMOELEMENTS AND DEVICES EMBODYING THEM

Filed March 16, 1961 2 Sheets-Sheet 1

Nov. 12, 1963 A. J. CORNISH 3,110,629

THERMOELEMENTS AND DEVICES EMBODYING THEM

Filed March 16, 1961 2 Sheets-Sheet 2

WITNESSES

Charles L. Menzemer

Edwin C. Basobas

INVENTOR

Albert J. Cornish

BY

Frederick Shapoe

ATTORNEY

3,110,629
THERMOELEMENTS AND DEVICES EMBODYING THEM

Albert J. Cornish, Forest Hills, Pa., assignor to Westinghouse Electric Corporation, East Pittsburgh, Pa., a corporation of Pennsylvania Filed Mar. 16, 1961, Ser. No. 96,121
3 Claims. (Cl. 136—4)

Figure 1:
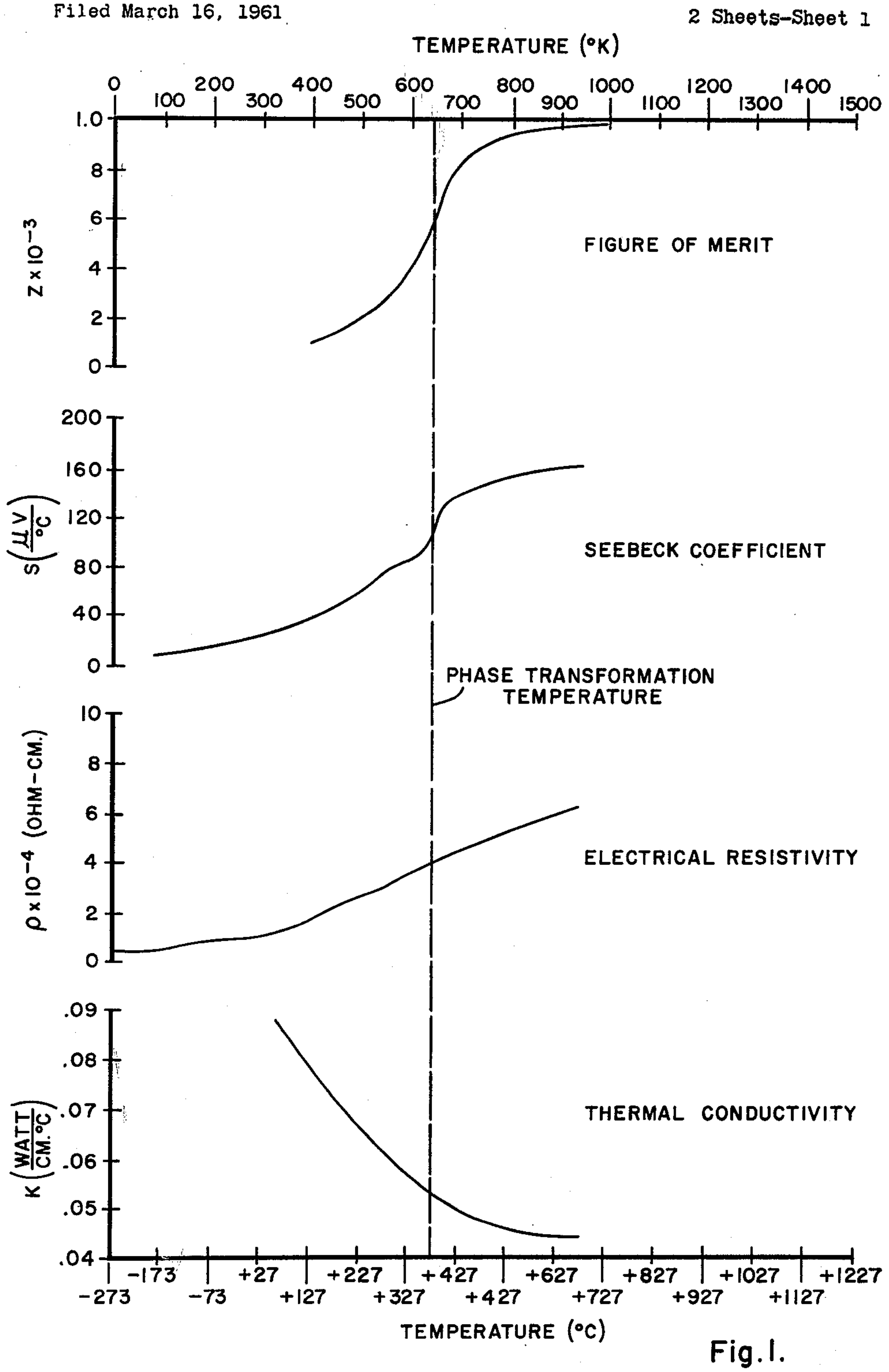

The present invention relates generally to thermoelements and thermoelectric devices and particularly to thermoelements comprised of germanium telluride and thermoelectric devices embodying the same.

The present application is a continuation-in-part of U.S. patent application Serial No. 787,041, filed January 15, 1959, now abandoned, the inventor and assignee of which are the same as in the present application.

It has been regarded as highly desirable to produce thermoelectric devices wherein either an electric current is passed therethrough whereby to provide for cooling application or alternately a source of heat is applied to one junction of thermoelectric device to bring this junction to a given elevated temperature while the other junction is kept at a low temperature, whereby an electrical voltage is generated in the device. For refrigeration applications in particular, one junction of the thermoelectric device is disposed within an insulated chamber and electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the thermoelectric power of the thermoelements employed, and to the temperature difference between the junctions. Accordingly, it is desirable that the thermoelements be made of such materials that, all other factors being equal, the highest potential is developed for the temperature difference between the hot and cold junctions. The electrical resistivity of the thermoelement member of the device and the thermal conductivity both should be as low as possible in order to reduce electrical losses and thermal losses.

Thermoelectric devices may be tested and a number indicating its relative effectiveness, called the figure of merit, may be computed from the test data. The higher the index of efficiency the more efficient is the thermoelectric design. The index of efficiency or figure of merit denoted as Z, is defined by:

$$Z=\frac{S^2\sigma}{K} \text{ or } Z=\frac{S^2}{Kp}$$

wherein S is the thermoelectric power (volts/degree), $\sigma$ is the electrical conductivity (ohm-cm.)$^{-1}$, K is the thermal conductivity (watt/cm.° C.), and $p$ is the electrical resistivity (ohm-cm.).

Those skilled in the art recognize the necessity of evaluating the figure of merit (Z), which cannot be done merely on the values of any one or two of the parameters: thermoelectric power, thermal conductivity, and electrical conductivity or electrical resistivity, in determining if a particular material is desirable for use in a thermoelectric power generating or refrigeration device. Such an evaluation is necessary since certain materials will have one or two parameters which initially appear to indicate that they would be useful thermoelectric materials, but the value of the other one or two parameters are such that their figure of merit is so low as to make them useless for commercial devices. For example, germanium has a thermoelectric power (S) of −260 $\mu$v. and an electrical conductivity of only 590 (ohm-cm.)$^{-1}$ which would give an $S^2\sigma$ product of $4\times10^{-5}$. However, the thermal conductivity of germanium is 0.240 watt/cm.° C., which results in a figure of merit (Z) of only $.17\times10^{-3}$ for germanium. This is considerably less than in currently available materials with figures of merit (Z) ranging from $0.8\times10^{-3}$ to over $1.0\times10^{-3}$. Some materials may exhibit reasonably satisfactory thermoelectric properties, but over only a limited temperature range, and therefore are not usable practically. Thus, materials such as $Ag_2Se$ have good thermal conductivity and average thermoelectric power and electrical conductivity but undergo a phase change at a relatively low temperature (133° C. for $Ag_2Se$) which renders them useless above that temperature.

Yoshiro Moriguchi and Yutaka Koga reported in the J. Phys. Soc. Japan 12 (1957) 100 that they had conducted some tests on both polycrystal and single crystal germanium telluride. Relative to the possible semiconductor usefulness of germanium telluride, Moriguchi and Koga limited their study only to determining the thermoelectric power and resistivity of germanium telluride and so, as pointed out above, did not determine if germanium telluride was a satisfactory thermoelectric material.

In addition, the Moriguchi and Koga work was limited, as indicated by the graphs accompanying the article, to a temperature range varying from −173° C. to about 373° C. It is known to those skilled in the art that germanium telluride undergoes a phase change from rhombohedral to cubic at 375° C. Moriguchi and Koga did not examine germanium telluride in the cubic phase, and analogizing to $Ag_2Se$ and other materials which undergo phase changes, one skilled in the art would conclude that germanium telluride would not be a useful thermoelectric material above 375° C.

The surprising discovery has now been made by applicant that germanium telluride is a better commercially useful thermoelectric material above the phase transformation temperature of 375° C., and that a germanium telluride thermoelectric element contained within a thermoelectric device may be thermal cycled repeatedly from below the phase transformation temperature to temperatures far in excess of the transformation temperature without degradation of the figure of merit of the germanium telluride. In fact, applicant has made the surprising discovery that germanium telluride has a higher figure of merit after transformation into the cubic crystal structure than in the rhombohedral crystal structure.

An object of the present invention is to provide a thermoelectric device comprising a thermoelectric element of stoichiometric germanium telluride.

Another object of the present invention is to provide a thermoelectric device, which operates in accordance with the Seebeck or the Peltier effect, and which comprises at least one p-type thermoelectric element consisting of stoichiometric germanium telluride whose figure of merit increases when the germanium telluride passes through a phase transformation from the rhombohedral to the cubic crystal structure.

Figure 2:
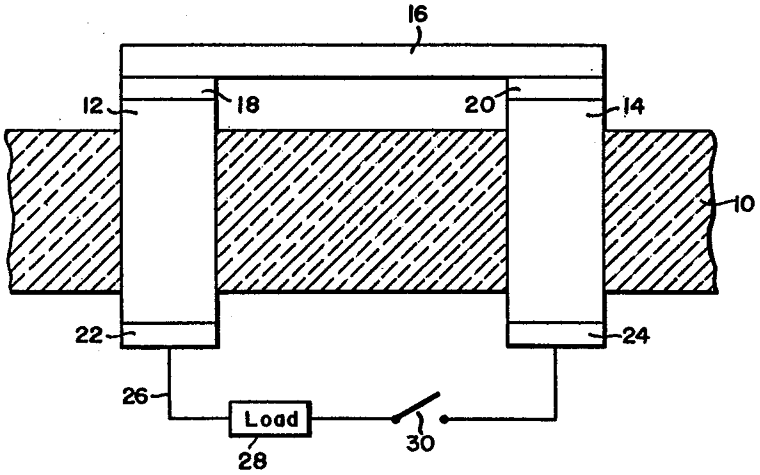

For a better understanding of the nature and objects of the invention, reference should be had to the following detailed description and drawings of which:

FIGURE 1 is a graphical presentation of the figure of merit, thermoelectric power (Seebeck coefficient), electrical resistivity, and thermal conductivity of stoichiometric germanium telluride; and FIG. 2 is a side view, partially in cross-section, of a thermoelectric power generator.

In accordance with the present invention and attainment of the foregoing objects, there is provided a thermoelectric device suitable for use at temperatures of above about 375° C. comprising a first p-type thermoelectric element comprised of homogeneous crystalline stoichiometric germanium telluride having a cubic phase at above about 375° C., and a first n-type thermoelectric element, one end of the p-type element and one end of the n-type element being electrically connected by an electrical conductor, whereby a first junction is formed across said ends of the p-type and the n-type elements, the other end of said p-type and said n-type element being connected through electrical circuit means, whereby second junctions are formed at said other end of the p-type and n-type elements, the device, when subjected to a temperature difference between junctions being capable of generating an electrical voltage, the germanium telluride element undergoing a phase transformation to the cubic crystal phase at about 375° C., and thereupon exhibiting greatly improved thermoelectric properties such that it has a figure of merit of about $1\times10^{-3}$ at 627° C.

The negative thermoelectric element may be comprised of a metal, for example, copper, silver and mixtures and alloys thereof and thermoelectric materials, for example, indium arsenide, aluminum arsenide, antimony telluride, and mixtures thereof. Since a thermoelement comprising germanium telluride is most efficient at a temperature in the range of approximately 375° C. to 635° C., it will be appreciated that the negative thermoelectric element material must also function well and be chemically and thermally stable within this temperature range.

One preferred method of preparing homogeneous crystalline germanium telluride suitable for use in accordance with the teachings of this invention comprises admixing stoichiometric proportions of finely divided germanium (Ge) and tellurium (Te) to form the compound germanium telluride (GeTe) and charging the mixture into a vessel of quartz or other inert material that will not react with the melt. The vessel is then evacuated and sealed off under a vacuum of approximately $10^{-4}$ mm. of Hg. The vessel is placed in a horizontal tube furnace and heated to a temperature in excess of 722° C., preferably a temperature of approximately 800° C., at which temperature the entire mixture becomes molten. The vessel is agitated to ensure complete mixing during the melting period, and then allowed to cool to room temperature. The solidified germanium telluride within the vessel is then suspended in the top zone of a vertical tube furnace having two heating zones. The top zone of the heating furnace is maintained at a temperature of at least 722° C., preferably about 800° C. The bottom zone of the furnace is maintained at a temperature below 722° C., preferably approximately 700° C. The vessel is slowly lowered through the top zone of the furnace to the bottom zone. Satisfactory results have been achieved when using a furnace having a top hot zone of twelve inches in length and a bottom cold zone of twelve inches in length when the vessel is lowered at the rate of approximately two inches per hour. After the vessel reaches the center of the bottom zone of the furnace, it is allowed to remain at a temperature of approximately 700° C. for several hours and then allowed to cool to room temperature.

In some cases the germanium telluride is zone refined. For thermoelectric purposes the germanium telluride should be a homogeneous crystalline body free from voids.

The following example illustrates the practice of the invention.

*Example I*

While germanium telluride may be prepared by several methods known in the art, it has been found that the following method is particularly satisfactory.

72.60 grams of germanium and 127.61 grams of tellurium were charged into a quartz bulb having an inside diameter of ⅝ inch. The bulb was evacuated and sealed off under a vacuum of $10^{-4}$ mm. of Hg. The bulb was then placed in a furnace and heated to 800° C. at which temperature the mixture became molten. The bulb was agitated to ensure mixing during the heating step, and then allowed to cool to a room temperature of approximately 25° C. The bulb was then suspended in the top zone of a vertical tube furnace having two heating zones. The top zone of the furnace was twelve inches long and the bottom heating zone was twelve inches long. The bulb was suspended at approximately the midpoint in the top heating zone of the furnace which was maintained at a temperature of 800° C. and the bulb allowed to descend through the top zone at a rate of approximately two inches per hour. Upon descending from the top heating zone the bulb entered the lower heating zone which was maintained at a temperature of 700° C. The bulb was allowed to pass through approximately ½ (6 inches) of the lower heating zone and then stopped in its descent and maintained at a temperature of 700° C. for approximately 8 hours. The resulting crystalline germanium telluride was then allowed to cool to room temperature. It has a p-type semiconductivity.

The homogeneous crystalline germanium telluride thus formed was cut into test wafers, tested for thermoelectric power (S), thermal conductivity (K) and electrical resistivity (p) at temperatures ranging from approximately 0° K. to 1000° K. The thermoelectric power (S) of the germanium telluride was determined by testing against copper. The wafers were repeatedly cycled through the phase transformation during the tests. The figure of merit (Z) was calculated using the equation:

$$Z=\frac{S^2}{pK}$$

wherein the terms have the meaning set forth hereinabove.

The values of thermoelectric power (Seebeck coefficient), thermal conductivity, electrical resistivity and figure of merit, over the approximate temperature range 0° K. to 1000° K., are set forth graphically in FIG. 1.

From FIG. 1, it can readily be seen that the figure of merit, rather than decreasing after the germanium telluride undergoes a phase transformation from rhombohedral to cubic at about 375° C., actually increases until it reaches a value of approximately $1\times10^{-3}$ at about 627° C. As is apparent from the graphs, this increase in the figure of merit after phase transition is due primarily to an increase in the Seebeck coefficient (thermoelectric power) and a decrease in thermal conductivity.

Referring to FIG. 2 of the drawings, there is illustrated a thermoelectric device suitable for producing electrical current from heat in accordance with the Seebeck Effect. A thermally insulating wall 10 so formed as to provide suitable furnace chamber is perforated to permit the passage therethrough of a positive germanium telluride thermoelectric element member 12 and a negative thermoelectric element member 14 such as indium arsenide. An electrically conducting strip of metal 16, for example, copper, silver or the like, is joined to an end face 18 of the element 12 and end face 20 of the element 14 within the chamber so as to provide a good electrical and thermal contact therewith. The end faces 18 and 20 may be coated with a thin layer of metal, for example, by vacuum evaporation or by use of ultrasonic brazing whereby good electrical contact is obtained between the element and the strip 16. The metal strip 16 of copper, silver or the like may be brazed or soldered to the metal coated faces 18 and 20. The metal strip 16 may be provided with suitable fins or other means for conducting heat thereto from the furnace chamber in which it is disposed.

At the other end of the element member 12 located on the other side of the wall 10 is attached a metal plate or strip 22 by brazing or soldering in the same manner as was employed in attaching metal strip 16 to the end face 18. Similarly, a metal strip or plate 24 may be connected to the other end of member 14. The plates 22 and 24 may be provided with heat dissipating fins or other cooling means whereby heat conducted thereto may be dissipated. The surface of the plates 22 and 24 may also be cooled by passing a current of a fluid such as water across their surfaces. An electrical conductor 26 containing a load 28 is electrically connected to the end plates 22 and 24. A switch 30 is interposed in the conductor 26 to enable the electrical circuit to be opened and closed as desired. When the switch 30 is moved to the closed position an electric current flows between element members 12 and 14 and energizes the load 28.

It will be appreciated that a plurality of pairs of the positive and negative members may be joined in series in order to produce a plurality of cooperating thermoelectric elements. In a similar manner each of the thermoelectric elements will be disposed with one junction in a furnace or exposed to any other source of heat while the other junction is cooled by applying water or blowing air thereon or the like. Due to the relative difference in the temperature of the junctions, an electrical voltage will be generated in the thermoelectric elements. By joining in series a plurality of the thermoelements, direct current at any suitable voltage will be generated.

It will be appreciated that the above description and drawing is only exemplary and not exhaustive of the invention.

I claim as my invention:

1. A thermoelectric device suitable for use at temperatures of above about 375° C. comprising a first p-type thermoelectric element comprised of homogeneous crystalline stoichiometric germanium telluride having a cubic crystalline phase at temperatures above about 375° C., and a first n-type thermoelectric element, one end of the p-type element and one end of the n-type element being electrically connected by an electrical conductor, whereby a first junction is formed across said ends of the p-type and the n-type elements, the other end of said p-type and said n-type element being connected through electrical circuit means whereby second junctions are formed at said other end of the p-type and n-type elements, the device, when subjected to a temperature difference between junctions being capable of generating an electrical voltage, the germanium telluride element undergoing a phase transformation from the rhombohedral to the cubic crystal phase at about 375° C., and thereupon exhibiting greatly improved thermoelectric properties such that it has a figure of merit of about $1 \times 10^{-3}$ at 627° C.

2. A thermoelectric device suitable for use at temperatures of above about 375° C. comprising a first p-type thermoelectric element comprised of homogeneous crystalline stoichiometric germanium telluride having a cubic crystalline phase at temperatures above about 375° C., and a first n-type thermoelectric element comprised of indium arsenide, one end of the p-type element and one end of the n-type element being electrically connected by an electrical conductor, whereby a first junction is formed across said ends of the p-type and the n-type elements, the other end of said p-type and said n-type element being connected through electrical circuit means whereby second junctions are formed at said other end of the p-type and n-type elements, the device, when subjected to a temperature difference between junctions being capable of generating an electrical voltage, the germanium telluride element undergoing a phase transformation from the rhombohedral to the cubic crystal phase at about 375° C., and thereupon exhibiting greatly improved thermoelectric properties such that it has a figure of merit of about $1 \times 10^{-3}$ at 627° C.

3. A thermoelectric device for generating electrical power at temperatures above about 375° C., comprising a first p-type thermoelectric element comprised of homogeneous crystalline stoichiometric germanium telluride having a cubic crystalline phase at temperatures above about 375° C., and a first n-type thermoelectric element, one end of the p-type element and one end of the n-type element being electrically connected by an electrical conductor, whereby a first junction is formed across said ends of the p-type and the n-type elements, the other end of said p-type and said n-type element being connected through electrical circuit means whereby second junctions are formed at said other end of the p-type and n-type elements, a heat source transmitting heat to said first junction, and a means for cooling said second junctions, whereby an electrical voltage is generated in the device, the germanium telluride element undergoing a phase transformation from the rhombohedral to the cubic crystal phase at about 375° C., and thereupon exhibiting greatly improved thermoelectric properties such that it has a figure of merit of about $1 \times 10^{-3}$ at 627° C.

References Cited in the file of this patent

UNITED STATES PATENTS

| | | |
|---|---|---|
| 2,712,563 | Faus | July 5, 1955 |
| 2,809,165 | Jenny | Oct. 8, 1957 |
| 2,841,559 | Rosi | July 1, 1958 |
| 2,858,275 | Folberth | Oct. 28, 1958 |
| 2,886,618 | Goldsmid | May 12, 1959 |

OTHER REFERENCES

Mariguchi et al., Journal Phys. Soc., Japan, volume 12, 1957, page 100.